United States Patent [19]

Iranmanesh et al.

[11] Patent Number: 5,387,813
[45] Date of Patent: Feb. 7, 1995

[54] TRANSISTORS WITH EMITTERS HAVING AT LEAST THREE SIDES

[75] Inventors: Ali A. Iranmanesh; David E. Bien, both of Sunnyvale; Michael J. Grubisich, San Jose, all of Calif.

[73] Assignee: National Semiconductor Corporation, Santa Clara, Calif.

[21] Appl. No.: 991,075

[22] Filed: Dec. 14, 1992

Related U.S. Application Data

[62] Division of Ser. No. 951,524, Sep. 25, 1992.

[51] Int. Cl.[6] .................... H01L 29/72; H01L 27/12
[52] U.S. Cl. ........................... 257/563; 257/554; 257/559; 257/560; 257/572; 257/573; 257/577; 257/579; 257/580; 257/588; 327/565; 327/577
[58] Field of Search ............... 257/554, 559, 560, 561, 257/562, 563, 566, 572, 573, 577, 578, 579, 580, 584, 588; 307/496

[56] References Cited

U.S. PATENT DOCUMENTS

| 3,918,080 | 11/1975 | Kerr ....................... 257/580 |
| 4,062,034 | 12/1977 | Matsushita . |
| 4,306,246 | 12/1981 | Davies et al. ............ 257/584 |
| 4,400,865 | 8/1983 | Goth et al. . |
| 4,639,757 | 1/1987 | Shimizu .................. 257/580 |
| 4,647,958 | 3/1987 | Gardner . |
| 4,738,624 | 4/1988 | Iyer et al. . |
| 5,014,107 | 5/1991 | Vora ....................... 257/554 |
| 5,068,702 | 11/1991 | Giannella ............... 257/579 |
| 5,098,853 | 3/1992 | Clark et al. . |
| 5,138,417 | 8/1992 | Noda ..................... 257/563 |
| 5,139,961 | 8/1992 | Solheim et al. . |
| 5,242,854 | 9/1993 | Solheim et al. . |

FOREIGN PATENT DOCUMENTS

| 0098209 | 1/1984 | European Pat. Off. ........... 257/579 |
| 0194832 | 9/1986 | European Pat. Off. . |
| 0450500 | 10/1991 | European Pat. Off. . |
| 0452720 | 10/1991 | European Pat. Off. . |
| 2618733 | 11/1976 | Germany . |
| 52-28879 | 3/1977 | Japan .................... 257/588 |
| 59-155959 | 9/1984 | Japan .................... 257/578 |
| 1-238061 | 9/1989 | Japan .................... 257/578 |

OTHER PUBLICATIONS

G. Gonzalez, *Microwave Transistor Amplifiers*, Prentice-Hall, Inc. 1984, pp. 31–34.
R. M. Warner, Jr., J. N. Fordemwalt, *Integrated Circuits* (McGraw-Hill, 1965), pp. 107–109.
E. S. Yang, *Fundamentals of Semiconductor Devices* (McGraw-Hill, 1978), pp. 241 ∝ 243.
G. Gonzalez, *Characteristics of Microwave Transistors*, Prentice-Hall, Inc. 1984, pp. 31–34.
E. S. Yang, *Microelectronic Devices* (McGraw-Hill, 1988), pp. 134–135.
R. S. Muller, T. I. Kamins, *Device Electronics for Integrated Circuits* (Second Edition 1986), pp. 331–335.
A. Iranmanesh, M. Biswal and B. Bastani, *Total System Solution with Advanced BiCMOS*, Solid State Technology, Jul. 1992, pp. 37–40.
H. F. Cooke, *Microwave Transistors: Theory and Design*, pp. 68–86, reprinted from *Proc. IEEE*, vol. 59, Aug. 1971, pp. 1163–1181.
S. Wolf, *Silicon Processing For The VLSI Era*, vol. 2, "Process Integration", pp. 472–475, 501–502 and 516–520, 1990.

*Primary Examiner*—Ngan V. Ngo
*Attorney, Agent, or Firm*—H. Donald Nelson; Michael Shenker; Richard J. Roddy

[57] ABSTRACT

A bipolar transistor is provided in which the base-emitter junctions do not traverse the base but terminate inside the top surface of the base. The transistor has long emitter perimeter available for current flow and more than two emitter sides (e.g., three sides) available for current flow, which allows obtaining a low base resistance, a low emitter resistance, a low collector resistance, a low base-collector capacitance, and a small size.

22 Claims, 14 Drawing Sheets

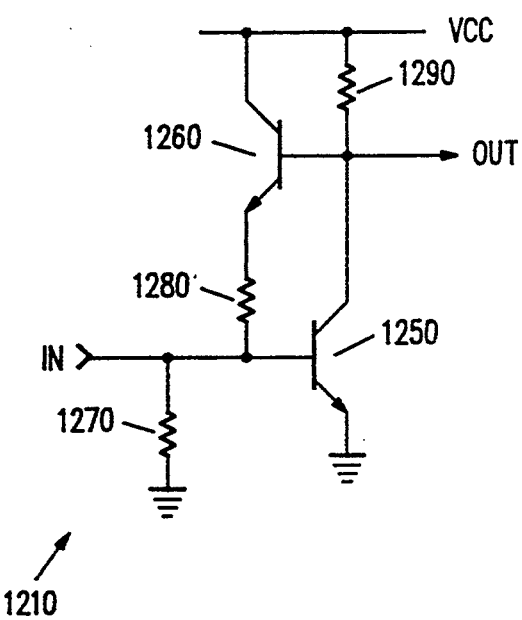
FIG. 12
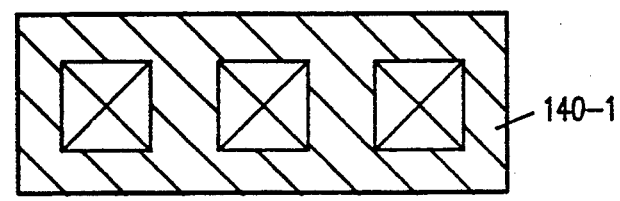
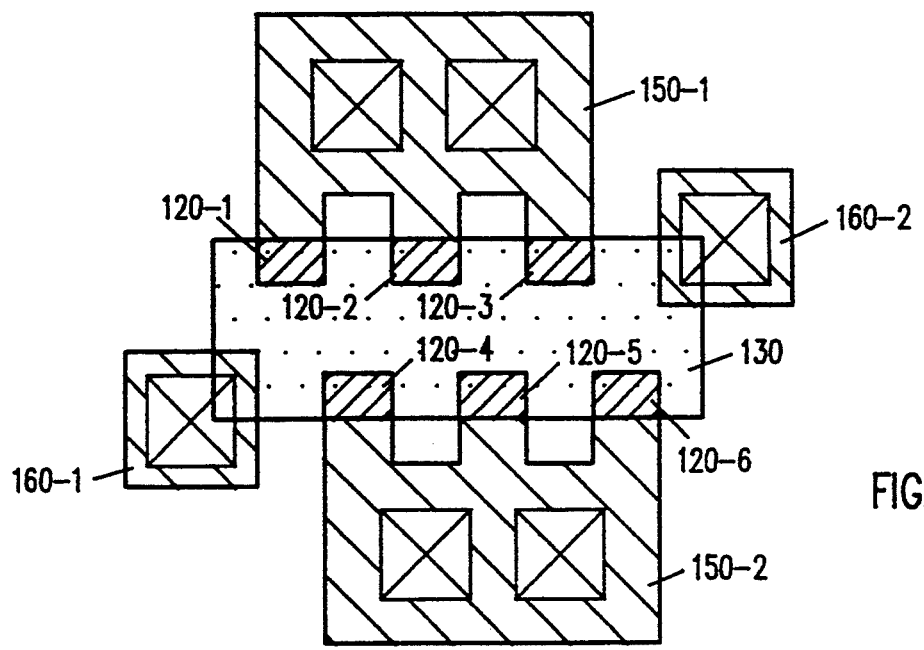
FIG. 13
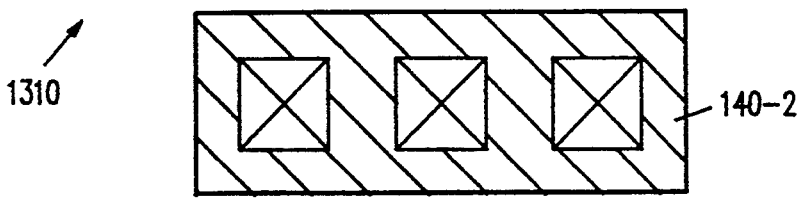

TRANSISTORS WITH EMITTERS HAVING AT LEAST THREE SIDES

This application is a division of application Ser. No. 07/951,524, filed Sep. 25, 1992.

BACKGROUND OF THE INVENTION

The present invention relates to electronic devices, and more particularly to bipolar transistors.

Bipolar transistors are widely used in both digital and analog circuits including computer processors, memories, power supplies, and others. Bipolar transistors are utilized for signal amplification, switching, bias generation, and for other purposes. While bipolar transistors are generally larger and less power efficient than their MOS counterparts, bipolar transistors are typically faster, and consequently bipolar transistors are widely used in fast memories, fast logic arrays, and many other super fast products for data- and telecommunications.

Typical goals in a bipolar transistor design include a low transistor-generated noise, a high current and power gain (which allow low-power operation), and a high frequency range (which permits a high speed). Another goal is good matching of the electrical characteristics of similar transistors, and in particular good VBE matching measured as the difference between the base-emitter voltages at equal collector currents. VBE matching is particularly important for monolithic circuit design which relies on similar transistors having similar electrical characteristics. These goals are advanced by reducing the transistor base resistance, the emitter resistance, the collector resistance, and the base-collector capacitance. The base resistance, in particular, is a major contributor to transistor-generated noise. Moreover, the base resistance decreases the frequency range of the transistor the transistor unity-power-gain frequency $f_{max}$ is inversely proportional to the base resistance. See, G. Gonzales, *Microwave Transistor Amplifiers* (Prentice-Hall, 1984), incorporated herein by reference, page 33. The emitter and collector resistances also contribute to noise and, further, they reduce the current gain and the power gain. In addition, the emitter resistance makes good VBE matching more difficult to obtain, particularly at high transistor currents. Further, the emitter and collector resistances and the base-collector capacitance decrease the transistor frequency range as they reduce both $f_{max}$ and the unity-current-gain frequency $f_T$. Thus, reducing the base, emitter and collector resistances and the base-collector capacitance are important goals in transistor design.

Another goal is a small size which is needed to obtain a high packing density in the integrated circuit. In addition, reducing the base size decreases the base-collector capacitance.

FIG. 1 shows in plan view a prior art transistor 110 having three emitters 120-1, 120-2, 120-3 extending across the underlying base 130. The collector (not shown) underlies the base and electrically contacts the collector contact regions 140-1, 140-2. Emitter contact region 150 interconnects the emitters. Base contact region 160 made from doped polysilicon overlying the base surrounds the emitters and extends between the emitters. Contact openings 164-1 through 164-6, 170-1 through 170-8, 180-1 through 180-6 in an insulating layer overlying the transistor allow the emitters, the base and the collector o be contacted by conductive layers overlying the insulating layer.

The emitters 120-i are made narrow, i.e., the emitter width WE is made small, in order to reduce the intrinsic base resistance RBI, i.e. the resistance to base current of the base portions underlying the emitters. Of note, base portions underlying the emitters (the "intrinsic base") are typically thinner in the vertical cross section and they are typically lighter-doped than the remaining ("extrinsic") base portion, and hence the intrinsic base resistance is a significant component of the total base resistance. The number of the emitters—three—is chosen to obtain a desired base-emitter junction area in accordance with the desired emitter current. Emitter contact openings 164-i are positioned away from the emitters not to restrict the emitter width—the contact openings are typically made wider than the emitters to obtain a low contact resistance in the openings. Base contact region portions 160-1, 160-2 extend between emitters 120-i to reduce the base resistance.

Reducing the base, emitter and collector resistances and providing a small size and a low base-collector capacitance are often conflicting goals requiring careful balancing. For example, making the emitters narrow reduces the base resistance but increases the emitter resistance. The base size becomes also increased as more emitters are needed to achieve the desired base-emitter area. Base contact region portions 160-1, 160-2 which extend between the emitters reduce the base resistance but increase the base size. Increased base size leads to a higher base-collector capacitance. The base and collector resistances can be reduced by increasing the base and collector width in the direction along the emitters, but the base size, the base-collector capacitance and the emitter resistance will suffer. Thus, there is a need for a transistor which simultaneously provides low base, emitter and collector resistances, a small base size, a small overall size, and a low base-collector capacitance.

SUMMARY OF THE INVENTION

The present invention provides a transistor with low base, emitter and collector resistances, a small base size, a small overall size and a low base-collector capacitance. These and other advantages are achieved in some embodiments by forming emitters so that their base-emitter junctions do not extend across the base but terminate inside the base. Such a layout increases the emitter perimeter available for current flow per the same emitter width and the same base-emitter area. The increased perimeter leads to reduced base resistance. The emitters can be made short to reduce the emitter resistance. The collector resistance is reduced due to an additional lateral direction in which the collector current paths spread from the emitter—the direction in which the emitter extends inside the base.

In some embodiments, the extrinsic base has on top a low resistivity material, e.g., titanium silicide. Because the base-emitter junctions do not extend across the base, the low-resistivity material interconnects the base surface between the emitters and thus makes it unnecessary for the base contact region to extend between the emitters. The base size can therefore be reduced, with the consequent increase in the packing density and reduction in the base-collector capacitance.

Other features and advantages of the invention are described below. The invention is defined by the appended claims.

BRIEF DESCRIPTION OF THE DRAWINGS

FIG. 5 illustrates base current coming from one emitter side in the transistor of FIG. 2.

FIG. 12 is a circuit diagram of an amplifier using a transistor of the present invention.

FIG. 13 is a plan view of a transistor according to the present invention.

DESCRIPTION OF THE PREFERRED EMBODIMENTS

Figure 2:
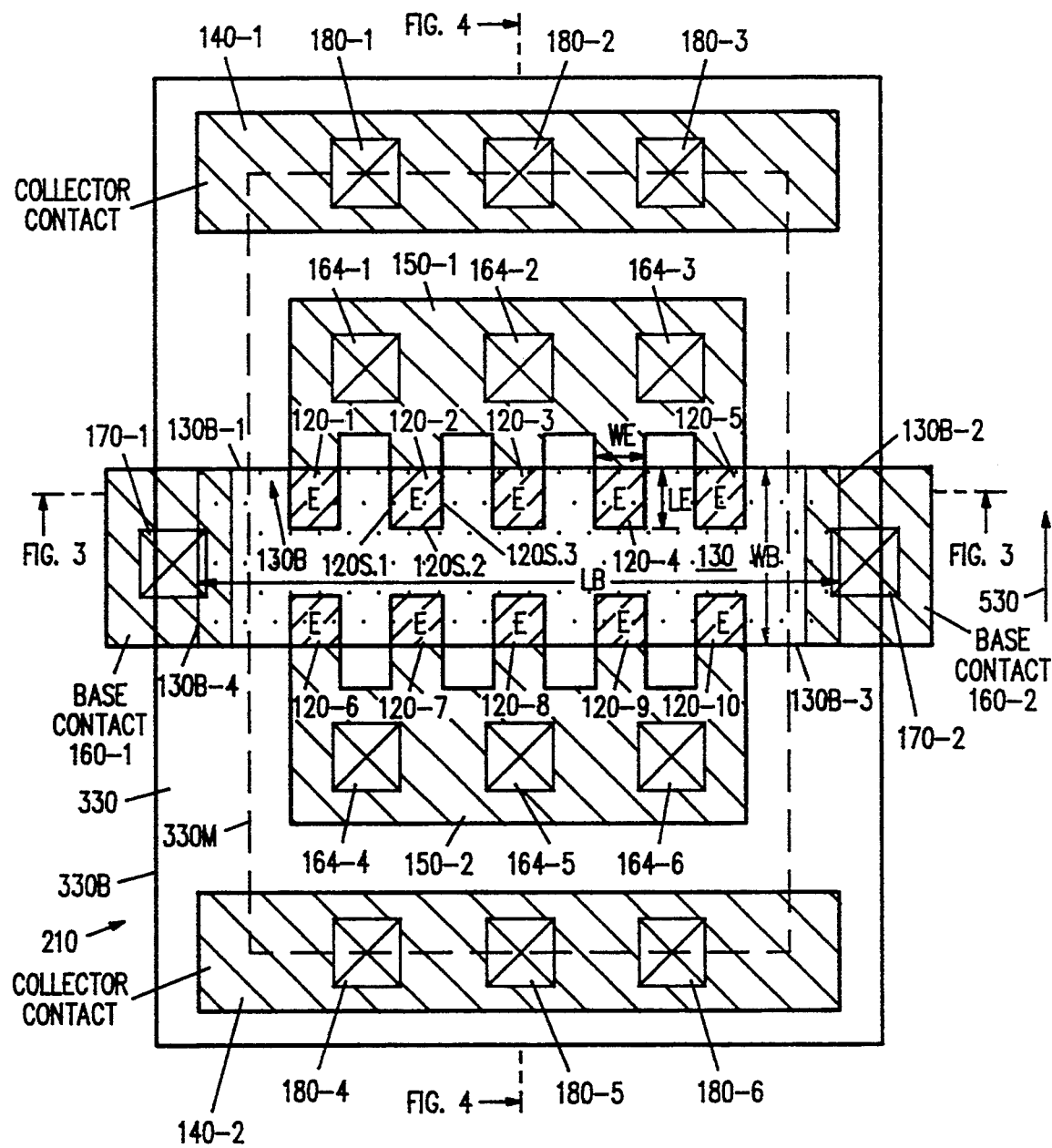
FIG. 2 is a plan view of a transistor according to the present invention.
Figure 3:
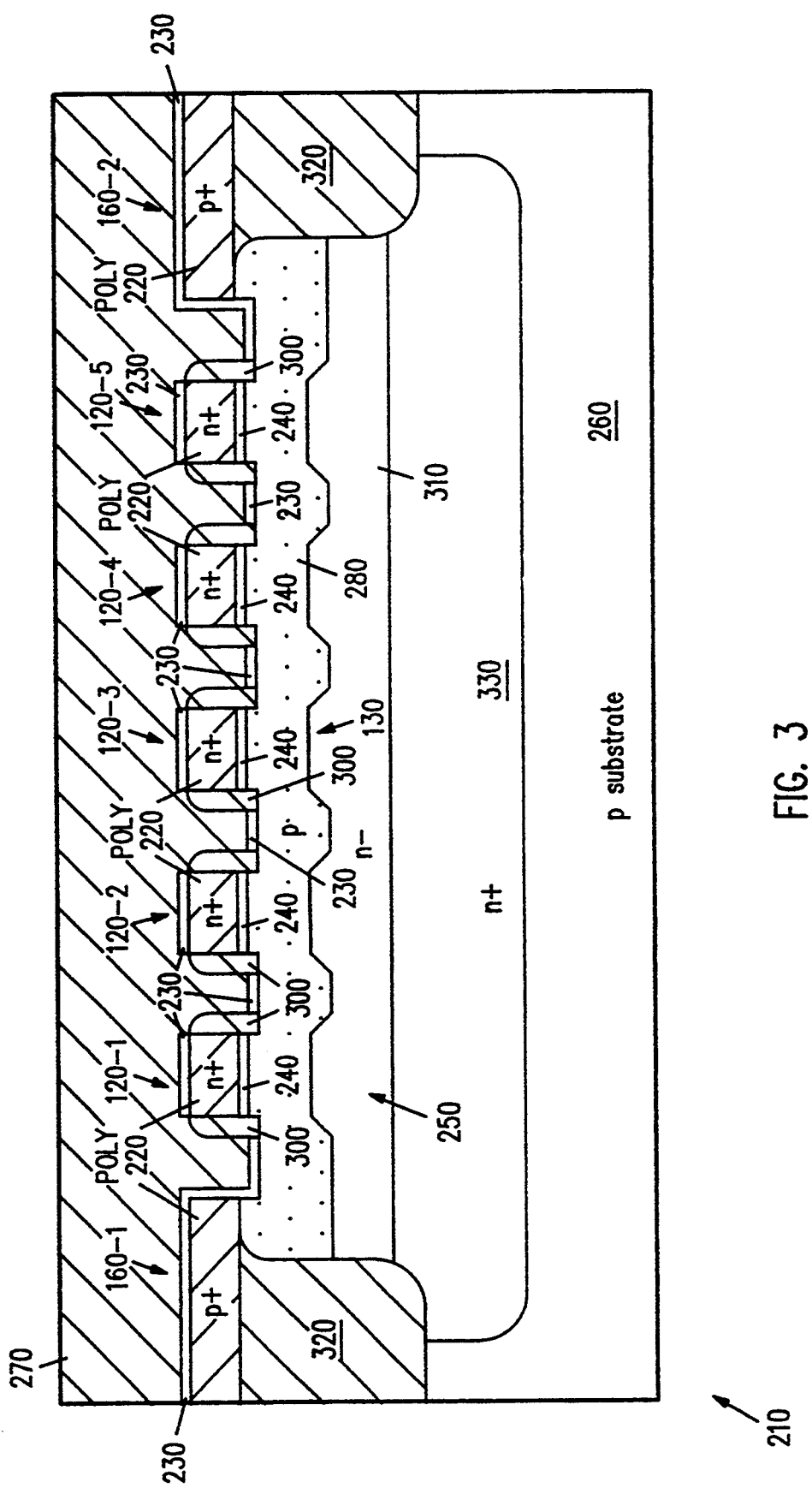
FIGS. 3 and 4 show vertical cross sections of the transistor of FIG. 2.
Figure 4:
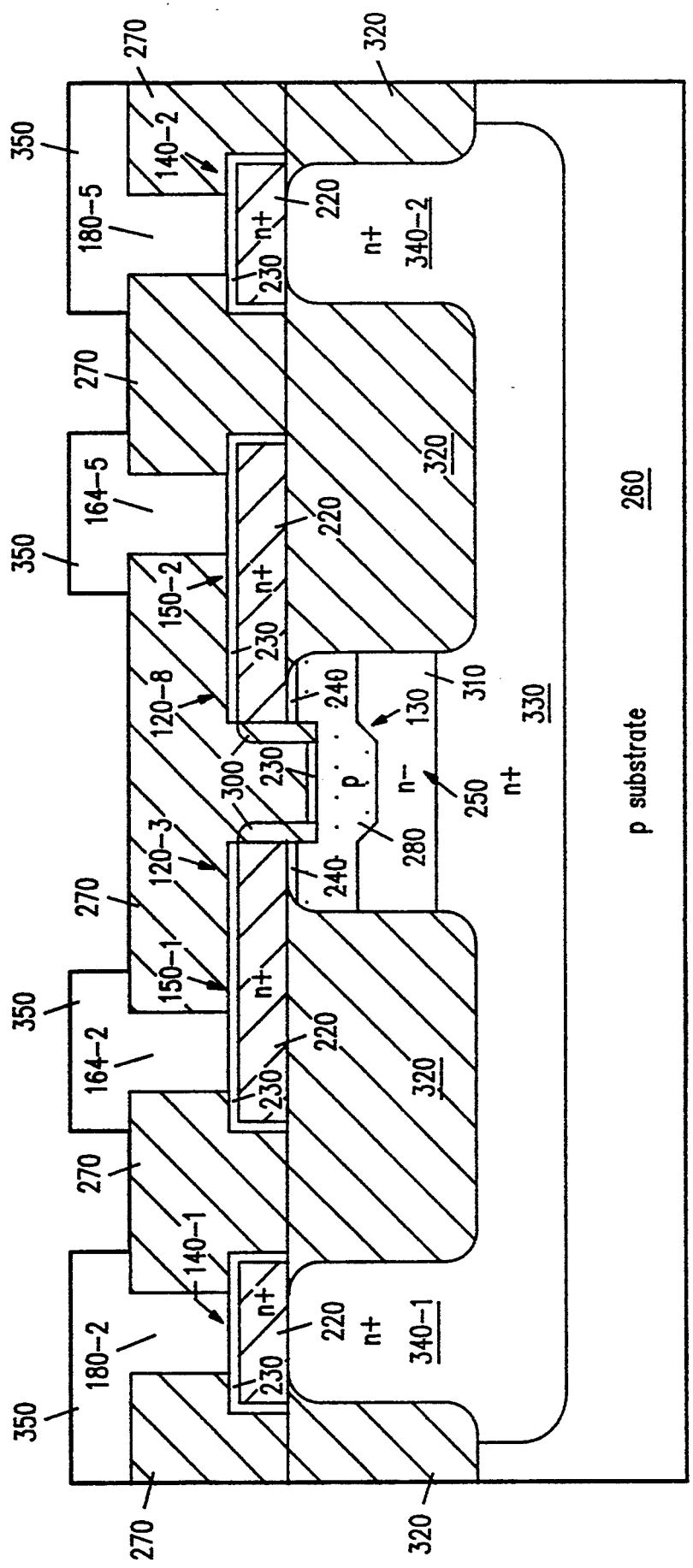

FIGS. 2–4 illustrate a transistor 210 in which the base-emitter junctions of emitters 120-1 through 120-10 do not extend across base 130 but terminate inside base 130. While transistor 210 is an npn transistor, similar pnp transistors are obtained by reversing the conductivity types in transistor 210.

As illustrated in FIGS. 3 and 4, emitters 120-i are formed from portions of polysilicon layer 220, from refractory metal silicide (e.g., titanium silicide) 230 overlying the polysilicon portions, and from n+ regions 240 of a monocrystalline silicon layer 250 which is grown epitaxially on p-doped monocrystalline silicon substrate 260. Emitter contact region 150-1 (FIGS. 2, 4) formed from polysilicon 220 and from the overlying metal silicide 230 interconnects emitters 120-1 through 120-5 and extends away from base 130. Similar emitter contact region 150-2 interconnects emitters 120-6 through 120-10 and extends away from the base. Emitter contact openings 164-1 through 164-6 in the overlying insulator 270 terminate on respective emitter contact regions 150-i rather than on emitters 120-i so as not to restrict the emitter size. In one embodiment, each contact opening 164-i is in plan view a square $1.0 \times 1.0 \mu$, and each emitter 120-i is a square $0.8 \times 0.8 \mu$.

Base 130 includes a p-doped region 280 (FIGS. 3, 4) in the epitaxial layer 250, and base 130 also includes portions of metal silicide layer 230 which overlie p doped region 280 away from the emitters. Silicon dioxide spacers 300 (not shown in FIG. 2 but shown in FIGS. 3, 4) which are formed on polysilicon sidewalls of emitters 120-i isolate the emitters from the base portions of the metal silicide.

Base 130 and n- collector 310 underlying the base are surrounded by field oxide regions 320 isolating the base and the collector from the rest of the integrated circuit. N+ buried layer 330 underlies collector 310 and the surrounding field oxide regions and provides a low resistance path from the collector to n+sinker regions 340-1, 340-2 (FIG. 4) which contact the respective collector contact regions 140-1, 140-2. Field oxide 320 surrounds the transistor and extends through the transistor outside the base/collector region and the sinker regions.

Collector contact regions 140-1, 140-2 (FIGS. 2, 4) are formed from n+ portions of polysilicon layer 220 and from the overlying metal silicide 230. Base contact regions 160-1, 160-2 are formed from p+ portions of layer 220 and from the overlying metal silicide 230. Base contact openings 170-1, 170-2 in insulator 270 terminate at respective base contact regions 160-1, 160-2. Collector contact openings 180-1 through 180-6 terminate at the collector contact regions. Conductive (e.g., metal) lines formed from layer or layers 350 (FIG. 4) contact the base, emitter and collector contact regions through the respective contact openings. These lines and, perhaps, overlying conductive lines (not shown) include lines interconnecting the two emitter contact regions 150-i, lines interconnecting the two base contact regions 160-i, and lines interconnecting the two collector contact regions 140-i.

As shown in FIG. 2, the top surface of base 130 is a rectangle. The top surface is more generally a polygon, or it may be of another shape. The boundary of the top surface is shown at 130B in FIG. 2, and the four sides of the boundary are shown respectively at 130B-1 through 130B-4. The base-emitter junction of each emitter 120-i is a rectangle which extends from the respective side 130B-1 or 130B-3 inside the top surface of the base and terminates inside the top surface, i.e., away from the top surface boundary 130B. Other shapes for the base-emitter junctions are possible. To reduce the intrinsic base resistance, the emitter width WE (marked for emitter 120-4 in FIG. 2) is chosen in some embodiments as the minimal width obtainable by the masking process by which the polysilicon layer 220 is patterned. In one embodiment, WE is $0.8\mu$, the length LE of each emitter is also $0.8\mu$, the base length LB measured as the distance between sides 130B-2 and 130B-4 is $10.2\mu$, and the base width WB measured as the distance between sides 130B-1 and 130B-3 is $2.8\mu$.

Transistor 210 has a low base resistance because transistor 210 has, for given emitter area and emitter width, a long three-sided emitter perimeter available for base current flow. For example, emitter 120-2 has three sides 120S.1, 120S.2, 120S.3 through which and under which the base current flows into the emitter, as compared to two sides in the prior art transistor 110 of FIG. 1. The base current paths in transistor 210 extend from under the three sides 120S.1, 120S.2, 120S.3 laterally away from the base-emitter junction. If, for example, the emitter length and width are each $0.8\mu$, then the perimeter portion available for base current flow is $0.8*3 = 2.4\mu$ for each emitter, $2.4*10 = 24\mu$ total for the ten emitters. By contrast, in the transistor 110 of FIG. 1, each emitter 120-i has only two sides available for current flow, and the total emitter perimeter available for current flow is only $16\mu$ for the same emitter width of $0.8\mu$ and the same emitter area of $0.8*0.8*10 = 6.4\mu^2$. Thus the emitter perimeter available for current flow is 50% higher in transistor 210.

The increased emitter perimeter available for current flow causes a significant reduction in both the extrinsic and the intrinsic base resistances by providing additional base current paths. More particularly, the extrinsic base resistance (RBX) includes the following two major components each of which is reduced due to the increased emitter perimeter available for current flow: (1) the resistance of the p doped base portion around the emitter perimeter; and (2) the contact resistance between the p doped portion and the overlying metal silicide 230.

Figure 5:
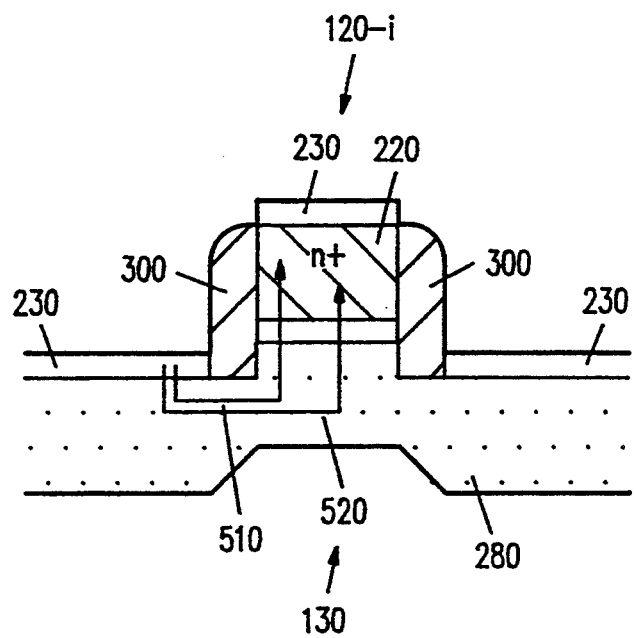
FIG. 5 shows a vertical cross section of a portion of the transistor of FIG. 2.

The intrinsic base resistance (RBI) is reduced because additional base current paths are provided in the intrinsic base under the emitter perimeter. In particular, some portions of the intrinsic base become closer to the emitter perimeter. Moreover, as illustrated by FIG. 5, an additional region is provided for those current paths which, like current path 510 in FIG. 5, enter the emitter near the emitter perimeter and which thus travel but a short distance through the intrinsic base. The additional region near the perimeter has a low resistance. More particularly, current path 510 has a lower resistance than current path 520 entering the emitter farther from the perimeter, because current path 510 has a smaller length in the high resistivity intrinsic base. The resistivity of the intrinsic base is 14 KΩ per square in one embodiment. Other resistivity values are used in other embodiments. Thus, increasing the emitter perimeter available for current flow leads to a reduction of the intrinsic base resistance.

Figure 1:
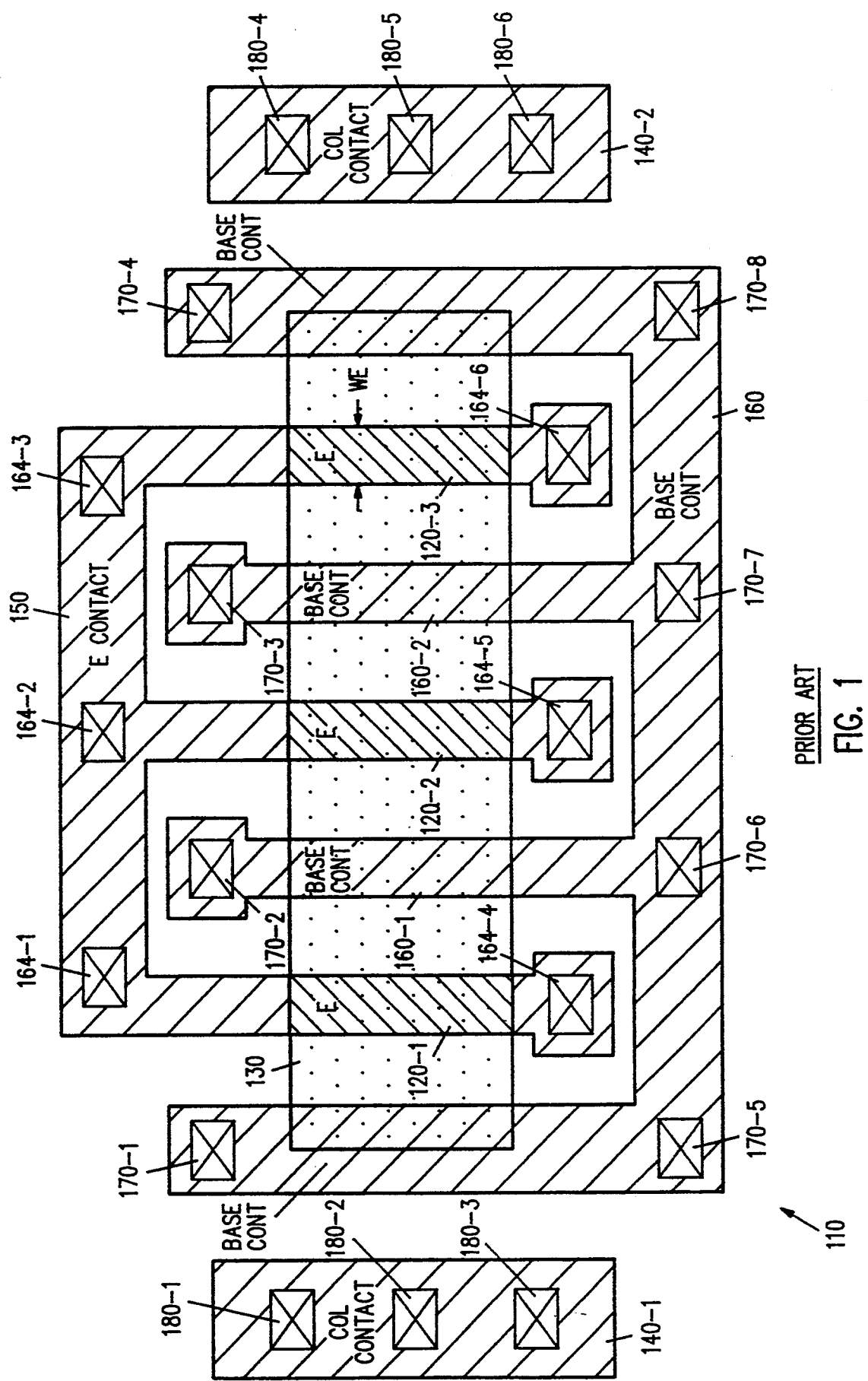
FIG. 1 is a plan view of a prior ar transistor.

The base resistance is reduced also because the perimeter of each emitter 120-i has three sides available for current flow rather than two sides as in the prior art FIG. 1 and because, therefore, the base current paths spread laterally from the emitter in three different directions orthogonal to the perimeter. Moreover, the additional side allows increasing the emitter perimeter per the same emitter area. The low base resistance leads to a low transistor-generated noise and a high frequency range as explained above. Further, the low base resistance capability allows one to meet the noise and frequency range requirements for a given application at a reduced base width, which in turn allows a higher packing density and a lower base-collector capacitance.

The collector resistance of transistor 210 is low because additional collector current paths are provided under the additional emitter perimeter and because the three emitter sides available for current flow allow the collector current paths to spread laterally in three different directions. The low collector resistance permits achieving a high transistor frequency range, a high current gain, a high power gain and a low transistor-generated noise, as explained above.

The emitter resistance is low in some embodiments because each emitter 120-i in these embodiments is short and hence each emitter is close to the respective emitter contact region 150-1 or 150-2. Moreover, transistor 210 has ten emitters connected in parallel, so that the total resistance of the silicide portion of the emitters is only 1/10 of the resistance of the silicide portion of a single emitter.

A low emitter resistance permits achieving a high current drive, a high power gain, good VBE matching, and a low transistor-generated noise, as explained above.

The base size and the overall size of transistor 210 are reduced in some embodiments because of the elimination of base contact region portions between the emitters—cf. base contact region portions 160-1, 160-2 in the prior art FIG. 1. The base contact regions in transistor 210 need not extend between the emitters because the base regions between the emitters are connected to base contact regions 160-1, 160-2 by low-resistivity metal silicide 230. (In one embodiment, metal silicide 230 is titanium silicide having resistivity of 2 Ω per square.) A small base size permits achieving a low base-collector capacitance, a high frequency range, and a high packing density, as explained above.

Transistor 210 is fabricated in some embodiments using one of the processes described in the following documents incorporated herein by reference: U.S. patent application Ser. No. 07/502,943 entitled "BICMOS DEVICE AND METHOD OF FABRICATION" filed Apr. 2, 1990 by V. Ilderem et al.; U.S. patent application Ser. No. 07/503,498 entitled "HIGH PERFORMANCE SEMICONDUCTOR DEVICES AND THEIR MANUFACTURE" filed Apr. 2, 1990 by A. G. Solheim et al.; and the article by A. Iranmanesh et al., *Total System Solution with Advanced BiCMOS*, Solid State Technology, July 1992, pages 37-40. In one embodiment, for example, transistor 210 is fabricated as follows.

A mask is formed on p substrate 260 to define buried layer 330. The boundary of the mask opening defining the buried layer is shown at 330M in FIG. 2. The n dopant implanted through the mask opening outdiffuses in subsequent processing steps to the boundary 330B defining the final position of the buried layer.

N- epitaxial layer 250 is then grown on the substrate, and field oxide regions 320 are formed in the epitaxial layer. The n+ buried layer extends partially into the epitaxial layer due to dopant outdiffusion.

An n dopant is implanted into the sinker regions 340-i. Then polysilicon layer 220 is deposited and doped by a p dopant. The p dopant diffuses into the epitaxial layer 250 and converts the region 280 of the epitaxial layer to the p conductivity type. Additional p and n dopants are selectively introduced into the polysilicon layer so that the polysilicon becomes doped n+ at the location of emitters 120-i and at the location of emitter contact regions 150-i and collector contact regions 140-i, and the polysilicon becomes doped p+ at the location of base contact regions 160-i. Polysilicon layer 220 is then masked and etched to define emitters 120-i, emitter contact regions 150-i, base contact regions 160-i, and collector contact regions 140-i. The polysilicon masking step is tolerant to mask misalignment because if the mask is shifted in the direction shown at 530 in FIG. 2 or in the opposite direction, the emitter area and the emitter perimeter available for current flow remain unchanged. For example, if the mask is shifted in direction 560, the area of emitters 120-6 through 120-10 increases by the same amount by which the area of emitters 120-1 through 120-5 decreases, and the perimeter available for current flow in emitters 120-6 through 120-10 increases by the same amount by which the perimeter available for current flow in emitter 120-1 through 120-5 decreases.

The dopants from polysilicon layer 220 are diffused into epitaxial layer 250 to form n+ emitter regions 240 and to increase the p dopant concentration in the base portion near base contact regions 160-i. The overetch of polysilicon layer 220 is controlled to be greater than the depth of emitter regions 240 in order to reduce the emitter-base capacitance. In one embodiment, the depth of regions 240 is about 500Å while the polysilicon is overetched by about 1200Å from the surface of epitaxial layer 250.

Additional p dopant is introduced into the extrinsic base. Oxide spacers 300 are formed around the emitters. Metal silicide 230, oxide 270, contact openings 164-i, 170-i and 180-i, and metal layer or layers 350 are then formed as described, for example, in the aforementioned U.S. patent application Ser. No. 07/503,498 (Solheim et al.).

Figure 6:
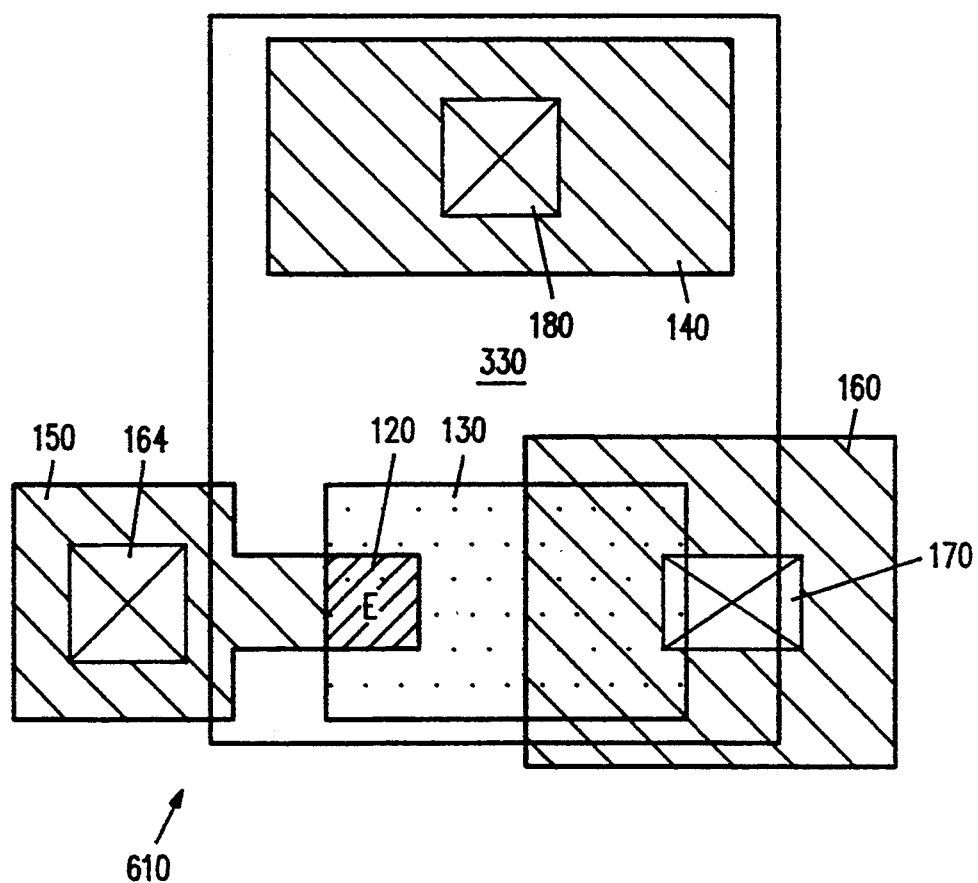
FIGS. 6–8 are plan views of transistors according to the present invention.

FIG. 6 shows transistor 610 having emitter 120 which terminates inside base 130. Such a design allows fabrication of transistors with a smaller emitter area and a smaller overall area than could be fabricated if the emitter were required to extend completely across base region 130. Emitter contact region 150, base contact region 160, buried layer 330, collector contact region 140, and contact openings 164, 170, 180 are similar to those of transistor 210. Some embodiments of transistor 610 are particularly suitable for small size, low power, high speed applications.

Figure 7:
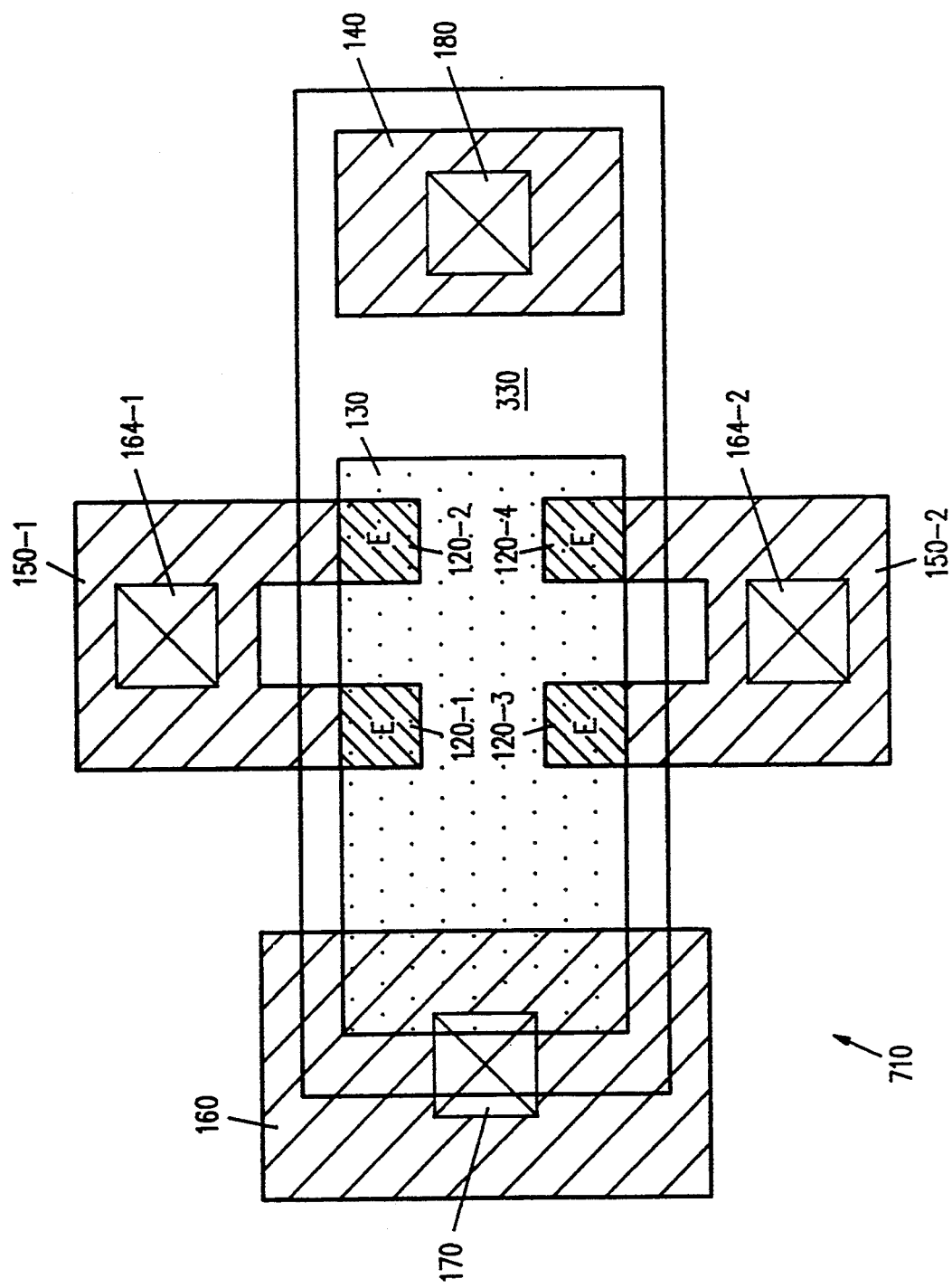

FIG. 7 shows transistor 710 having four emitters 120-1 through 120-4 which terminate inside base 130. Emitter contact regions 150-1, 150-2, base contact region 160, buried layer 330, collector contact region 140, and contact openings 164-1, 164-2, 170, 180 are similar to those of transistor 210.

Figure 8:
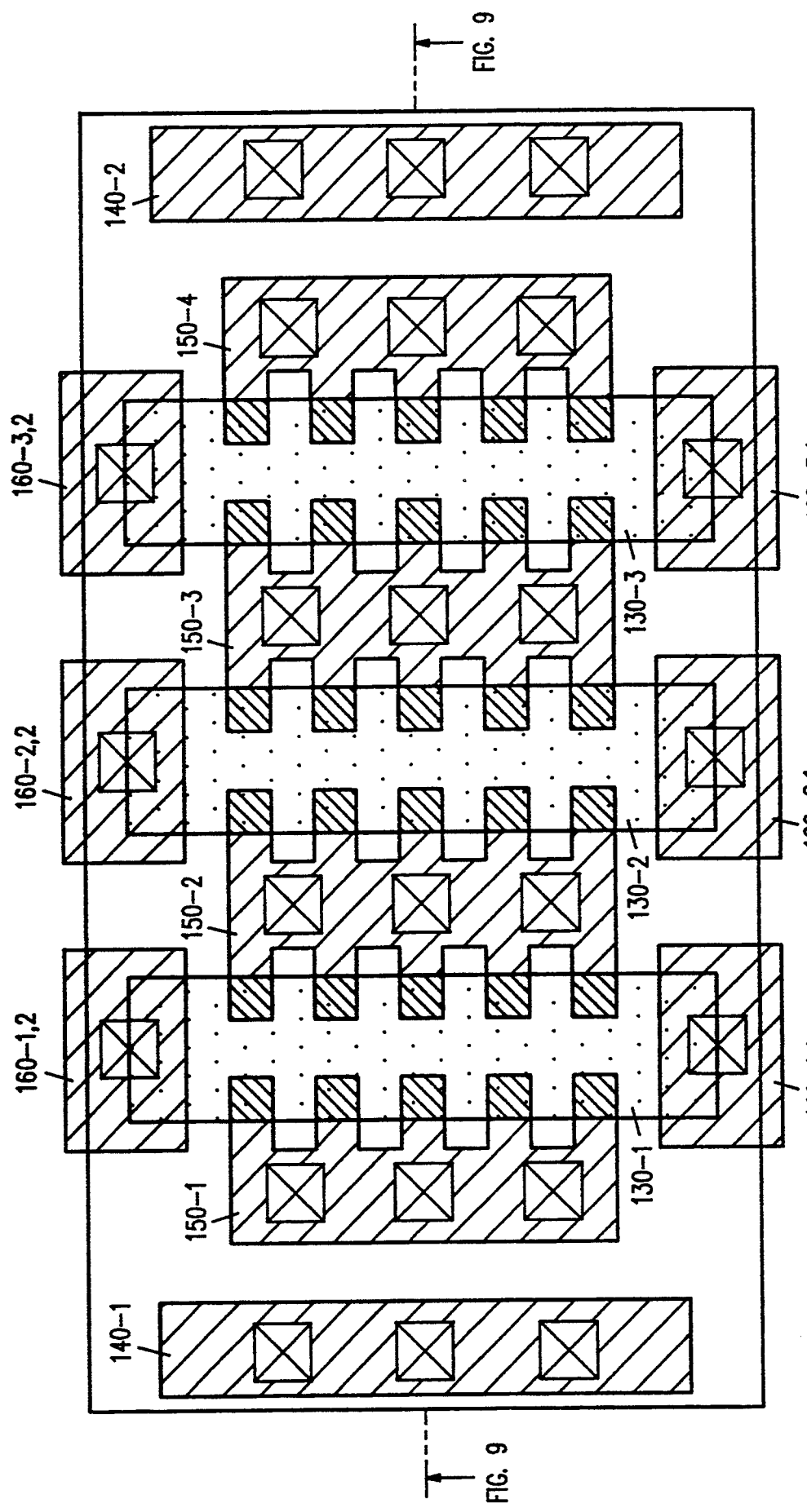
Figure 9:
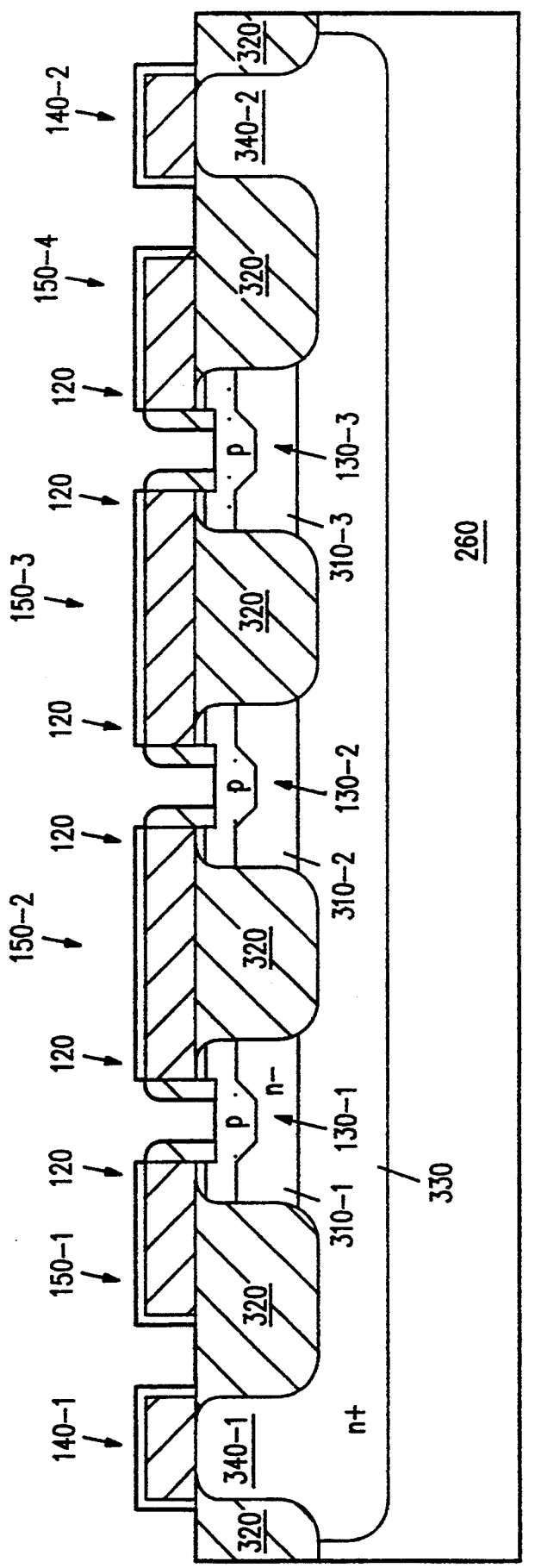
FIG. 9 shows a vertical cross section of the transistor of FIG. 8.

FIGS. 8 and 9 illustrate transistor 810 having three base regions 130-1, 130-2, 130-3 separated from each other by field oxide regions 320. Collectors 310-1, 310-2, 310-3 (FIG. 9) separated by the same field oxide regions underlie the respective base regions. Ten emitters 120 overlie each base region 130-i and terminate inside the base region. The emitters overlying each base region are connected, in groups of five, to respective emitter contact regions 150-i. Contact region 150-2 is shared between five emitters overlying the base region 130-1 and five emitters overlying the base region 130-2. Contact region 150-3 is shared between five emitters overlying the base region 130-2 and five emitters overlying the base region 130-3.

Buried layer 330 extends under collectors 310-i and the surrounding field oxide regions 320 to sinker regions 340-1, 340-2 which contact the respective collector contact regions 140-1, 140-2. Base contact regions 160-i,1, 160-i,2 contact the respective base region 130-i (i=1, 2, 3).

An insulator (not shown) similar to insulator 270 of FIGS. 3, 4 overlies the transistor. The contact openings in the insulator are located as shown in FIGS. 8 and 9. A conductive layer or layers (not shown) similar to layer or layers 350 of FIG. 4 contact the base contact regions, the emitter contact regions and the collector contact regions through the respective contact openings. The conductive layer or layers and, perhaps, overlying layers provide lines interconnecting the emitter contact regions 150-i, lines interconnecting the base contact regions 160-i,j, and lines interconnecting collector contact regions 140-i.

Figure 10:
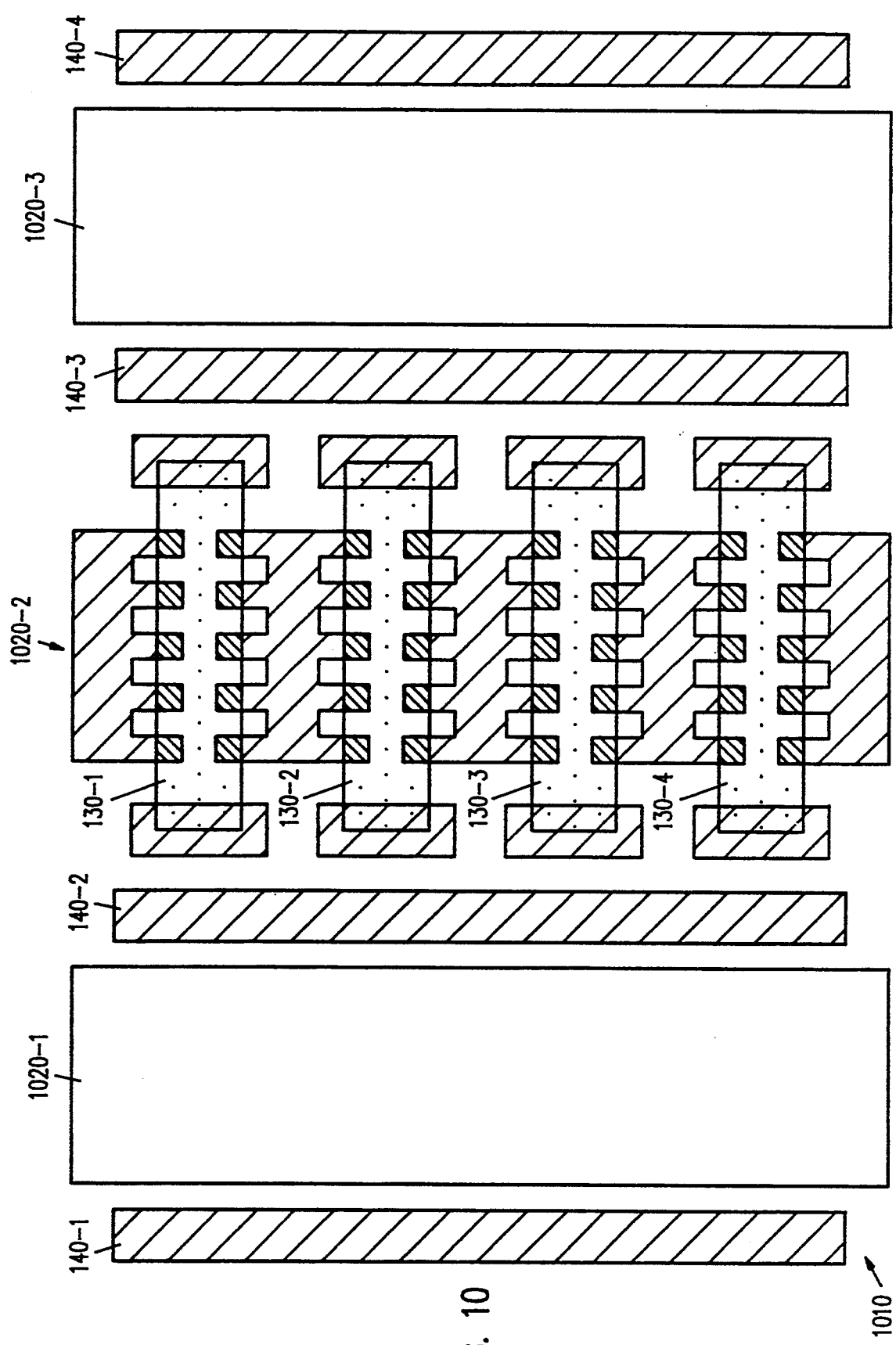
FIGS. 10 and 11 are plan views of transistors according to the present invention.

Transistor 1010 of FIG. 10 has three identical base/emitter structures 1020-1, 1020-2, 1030-3. For simplicity, only structure 1020-2 is shown in detail. Each structure 1020-i includes base regions and emitter regions. Each structure 1020-i is similar to the base/emitter structure of transistor 810 (FIGS. 8, 9) though each structure 1020-i has four, rather than three, base regions 130-i. Collector contact regions 140-i in FIG. 10 run along the base contact regions on two sides of each structure 1020-i. The buried layer (not shown) underlies the base, emitter, and collector regions, and the buried layer contacts the collector contact regions 140-i through the respective sinkers (not shown). Field oxide (not shown) surrounds the transistor and extends through the transistor outside the base/collector regions and the sinkers as in transistor 210.

Figure 11:
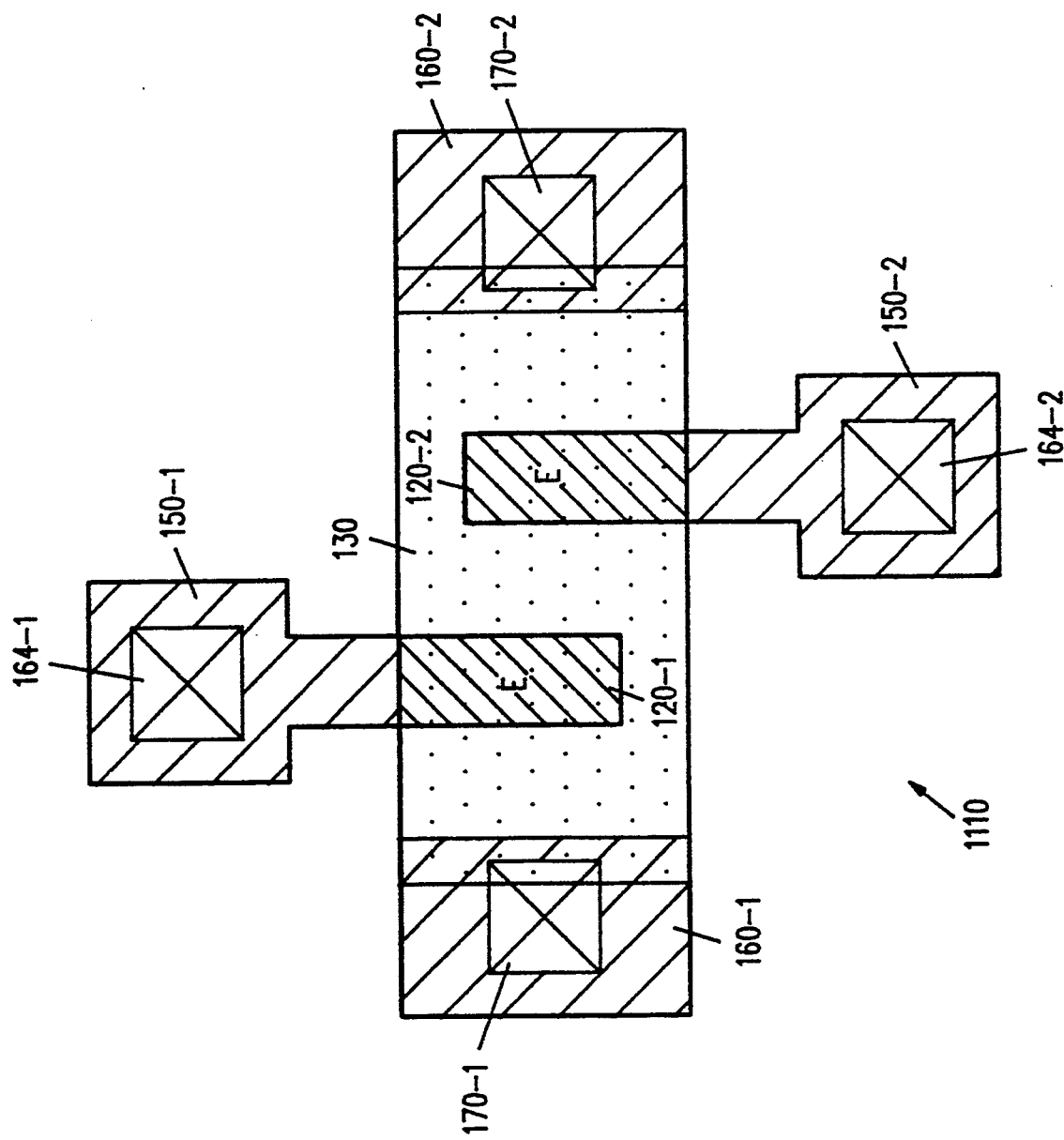

FIG. 11 shows transistor 1110 in which each base-emitter junction extends inside base 130 by more than half the base width. Emitter contact regions 150-i, base contact regions 160-i, and contact openings 164-i, 170-i are similar to those in transistor 210. One or more collector contact regions (not shown) are provided adjacent the base/emitter structure of transistor 1110. The buried layer (not shown) is similar to that of transistor 210.

FIG. 13 shows transistor 1310 in which the emitters 120-1 through 120-3 on one side of the base are shifted in the horizontal direction along the base length with respect to the emitters 120-4 through 120-6 on the other side of the base. The base contact regions 160-i are shifted counter clockwise along the edges of base 130. The emitter contact regions 150-i and the collector contact regions 140-i are similar to those of transistor 210.

Figure 14:
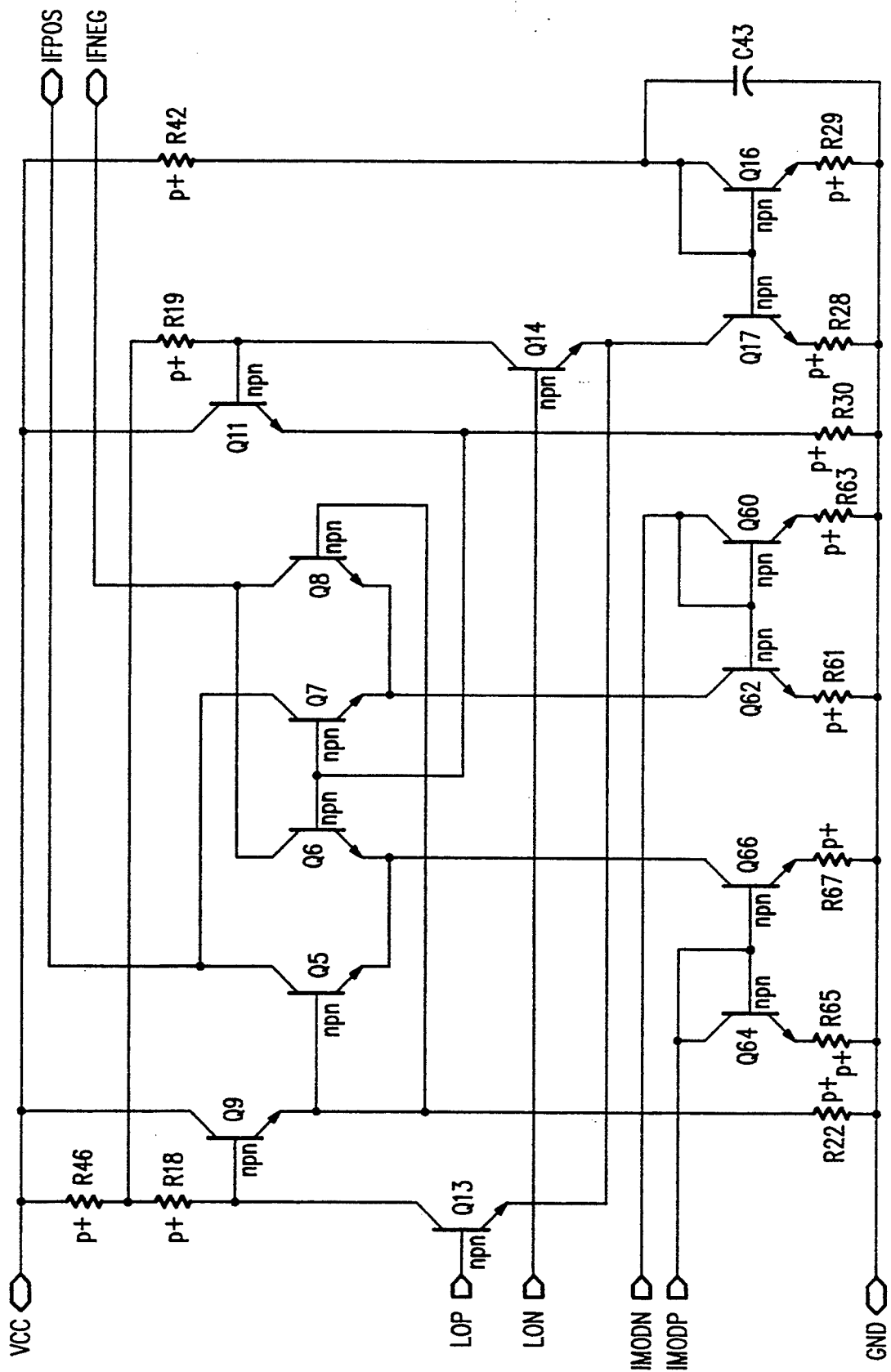
FIG. 14 is a circuit diagram of a modulator using transistors of the present invention.

FIG. 14 shows a circuit diagram of a modulator that multiplies the differential voltage on inputs LOP, LON by the differential current on inputs IMODP, IMODN and provides the resulting differential current on inputs IFPOS, IFNEG. Transistors Q64, Q66 and transistors Q62, Q60 are, respectively, two current mirrors which take input currents from respective inputs IMODP, IMODN and supply scaled currents to the emitters of the respective differential pairs formed, respectively, by transistors Q5, Q6 and by transistors Q7, Q8. The differential voltage on inputs LOP, LON (that is, the voltage on input LOP minus the voltage on input LON) is amplified by transistors Q13, Q14 and is applied to the bases of the respective differential pairs via emitter followers Q9, Q10. All the transistors in FIG. 14 are npn transistors with three-sided emitters of the type described above with respect to FIGS. 2-11 and 13. The three-sided emitter transistors improve the VBE matching, the speed and the noise level.

Figure 15A:
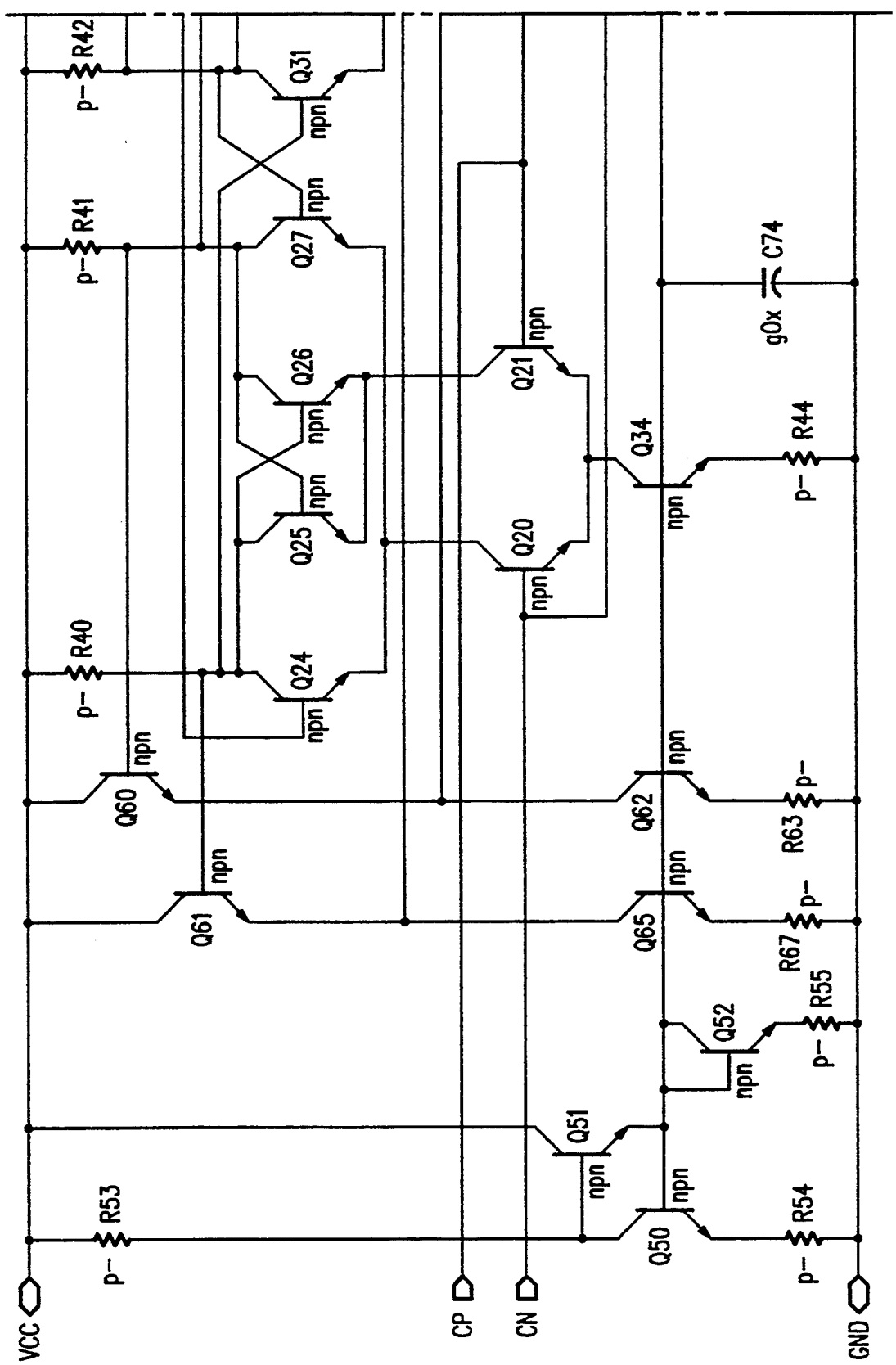
FIGS. 15A and 15B are a circuit diagram of a divide-by-2 circuit using transistors of the present invention.
Figure 15B:
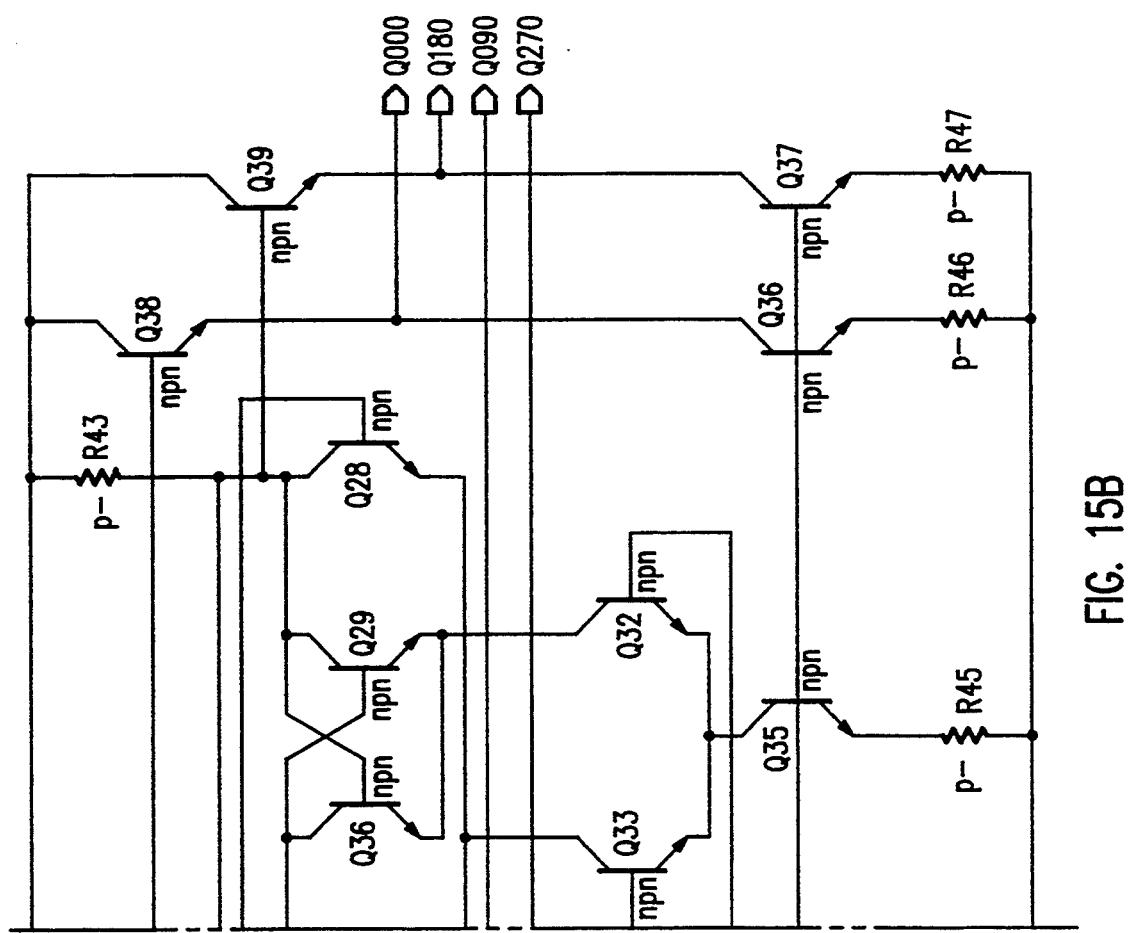
Figure 15B:
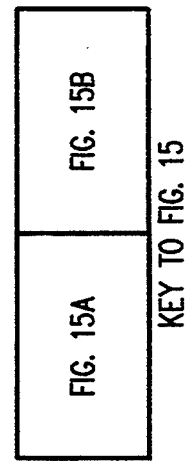

FIG. 15 shows a circuit diagram of a divide-by-2 circuit that divides by 2 the differential clock signal on inputs CP, CN and provides four clock signals on the respective outputs Q000, Q180, Q090, Q270 with the frequency equal to one half the frequency of the differential clock signal and with the phase relationships, respectively, 0°, 90°, 180°, and 270° with respect to the differential clock signal. The circuit of FIG. 15 uses Common-Mode-Logic (CML) latches configured as a T-flip-flop. All the transistors in FIG. 15 are npn transistors with three-sided emitters such as described above in connection with FIGS. 2-11 and 13.

Transistors 610, 710, 810, 1010, 1110 and 1310 are fabricated in some embodiments by the processes described above in connection with transistor 210.

Transistors 210, 610, 710, 810, 1010, 1110 and 1310, and similar transistors, are suitable for a wide variety of digital and analog integrated circuits. An example of one such circuit—a low noise amplifier 1210—is shown in FIG. 12. Input IN of the amplifier is connected to the base of npn transistor 1250. The emitter of transistor 1250 is connected to ground, and the collector is connected to the amplifier output OUT. Output OUT is connected to the base of npn transistor 1260 whose collector is connected to voltage supply VCC. Resistors 1270, 1280 connect input IN, respectively, to ground and to the emitter of transistor 1260. Resistor 1290 connects output OUT to voltage supply VCC. Transistor 1250 is a low noise transistor having the structure of one of the transistors described above in connection with FIGS. 2-11 or a similar structure. Transistor 1260 has also in some embodiments the structure of one of the transistors described above in connection with FIGS. 2-11 or a similar structure.

While the invention has been illustrated with respect to the embodiments described above, other embodiments and variations not described herein are within the scope of the invention. In particular, the invention includes pnp transistors obtained by reversing the conductivity types in the npn transistors. Further, the invention is not limited by the particular materials. For example, polysilicon 220 and metal silicide 230 are replaced by, or used in conjunction with, other materials in some embodiments. The invention covers non-silicon devices including, for example, germanium and gallium arsenide devices. The invention is not limited by the crystal structure of the materials or by the particular sizes of the base, emitter, and other regions. Other embodiments and variations are within the scope of the invention as defined by the following claims.

What is claimed is:

1. A transistor comprising:
    a collector;
    a base overlying and contacting said collector, said base having a top surface, said top surface having a boundary, said base comprising: (1) a semiconductor region, and (2) a conductive metal-containing region overlying and contacting said semiconductor region;
    a first emitter overlying said top surface of said base, said first emitter comprising semiconductor material which extends up higher than said base, said first emitter and said base forming a first contiguous base-emitter junction which junction extends from said boundary of said top surface inside said top surface and terminates inside said rod surface, said junction having in plan view at least three sides extending inside said top surface; and
    a second emitter spaced from said first emitter, said second emitter overlying said top surface of said base, said second emitter comprising semiconductor material which extends up higher than said base, said second emitter and said base forming a second contiguous base-emitter junction which junction extends from said boundary of said top surface inside said top surface and terminates inside said top surface, said second junction having in plan view at least three sides extending inside said top surface,
    wherein said conductive metal-containing region is spaced from said first and second emitters, and said conductive metal-containing region extends along at least three sides of each of said first and second base-emitter junctions.

2. The transistor of claim 1 wherein said first base-emitter junction comprises:
    a first side extending from the boundary of said top surface of said base inside said top surface; and
    a second side at an angle to said first side, at least a part of said second side lying inside said top surface.

3. The transistor of claim 2 wherein said angle between said first and second sides is 90°.

4. The transistor of claim 2 wherein:
    said second side lies entirely inside said top surface; and
    said first base-emitter junction further comprises a third side at an angle to said second side, said third side extending from inside said top surface to said boundary of said top surface.

5. The transistor of claim 3 wherein the angle between said first and second sides is 90° and the angle between said second and third sides is 90°.

6. The transistor of claim 1 wherein said top surface of said base is a-polygon having a plurality of sides, wherein said first base-emitter junction extends from one of the sides of said polygon inside said top surface, and wherein said first base-emitter junction is spaced from all the other sides of said polygon.

7. The transistor of claim 1 wherein said first base-emitter junction is substantially a rectangle in which two opposite sides extend from said boundary of said top surface inside said top surface and in which a third side lies entirely inside said top surface.

8. The transistor of claim 7 wherein said first base-emitter junction is substantially a square.

9. The transistor of claim 1 further comprising:
    a conductive material extending from said first emitter away from said top surface of said base; and
    an insulator overlying said conductive material and said first emitter, said insulator having an opening therethrough for contacting said first emitter, said opening terminating at said conductive material.

10. An amplifier comprising:
    an input terminal;
    a first transistor as recited in claim 1;
    means for connecting said base of said first transistor to said input terminal;
    means for connecting said first emitter of said first transistor to a reference voltage;
    an output terminal;
    means for connecting said collector of said first transistor to said output terminal;
    means for connecting said output terminal to a power supply;
    a second transistor having an emitter, a base and a collector;
    means for connecting said emitter of said second transistor to said base of said first transistor;
    means for connecting said base of said second transistor to said output terminal; and
    means for connecting said collector of said second transistor to said power supply.

11. The transistor of claim 1 further comprising a conductive material interconnecting said first and second emitters.

12. The transistor of claim 11 wherein:
    said conductive material comprises a portion of a conductive layer;
    said first emitter comprises a portion of said conductive layer; and
    said second emitter comprises a portion of said conductive layer.

13. The transistor of claim 1 wherein said first emitter comprises a region formed from a portion of a conductive layer and said second emitter comprises a region formed from a portion of said conductive layer such that if, due to a mask misalignment occurring during fabrication of said portions of said conductive layer, said portions are shifted in a predetermined direction relative said base, an area of said first base-emitter junction increases by the same amount by which an area of said second base-emitter junction decreases, and a length of a perimeter portion of said first base-emitter junction which perimeter portion extends from said boundary of said top surface of said base inside said top surface increases by the same amount by which a length of a perimeter portion of said second base-emitter junction which portion extends from said boundary of said top surface of said base inside said top surface decreases.

14. The transistor of claim 1 further comprising a base contact region which overlies and contacts said top surface of said base, wherein:
   said first and second base-emitter junctions define a region therebetween which includes at least a portion of said conductive metal-containing region; and
   said base contact region is spaced from said region between said first and second base-emitter junctions, and said base contact region contacts said conductive metal-containing region.

15. The transistor of claim 1 wherein:
   said top surface of said base comprises contiguous portions S-1 and S-2 separated from each other by an insulator;
   said first base-emitter junction lies on said top surface portion S-1; and
   said second base-emitter junction lies on said top surface portion S-2.

16. The transistor of claim 1 wherein:
   said collector comprises monocrystalline silicon;
   said base comprises monocrystalline silicon; and
   said first emitter comprises:
      polycrystalline silicon; and
      monocrystalline silicon underlying and contacting said polycrystalline silicon.

17. The transistor of claim 16 wherein said base further comprises a material M overlying said monocrystalline silicon of said base and having a lower resistivity than said monocrystalline silicon of said base, said material M being spaced from said first base-emitter junction.

18. The transistor of claim 17 wherein said material M comprises a metal silicide.

19. The transistor of claim 1 wherein a boundary of said first base-emitter junction consists of:
   a first portion lying on said boundary of said top surface of said base; and
   a second contiguous portion extending from end points of said first portion inside said top surface of said base.

20. The transistor of claim 19 wherein for any point on said second contiguous portion which point lies inside said top surface, when said transistor is on, a current flows across the first base-emitter junction between said first emitter and said base along a path whose portion extends from under said point into said base and laterally away from said first base-emitter junction.

21. The transistor of claim 1 wherein:
   said semiconductor region of said base comprises silicon; and
   said conductive metal-containing region comprises a metal silicide.

22. The transistor of claim 1 further comprising dielectric spacers on sidewalls of said first emitter which spacers isolate said first emitter from said conductive metal-containing region.

* * * * *

UNITED STATES PATENT AND TRADEMARK OFFICE
CERTIFICATE OF CORRECTION

PATENT NO.   : 5,387,813
DATED        : February 7, 1995
INVENTOR(S)  : Ali A. Iranmanesh et al.

It is certified that error appears in the above-identified patent and that said Letters Patent is hereby corrected as shown below:

Col. 1, line 67
       Delete "o" and insert --to--.

Col. 2, line 68
       Delete "ar" and insert --art--.

Col. 5, line 59
       Underline --cf.--.

Col. 9, line 33
       Delete "rod" and insert --top--.

Col. 10, line 5
       Delete "-".

Col. 11, line 6
       Delete "."

Signed and Sealed this

Seventeenth Day of October, 1995

Attest:

BRUCE LEHMAN

*Attesting Officer*      *Commissioner of Patents and Trademarks*